United States Patent
Arimitsu et al.

(10) Patent No.: US 6,625,434 B1
(45) Date of Patent: Sep. 23, 2003

(54) METHOD OF PERFORMING AUTOMATIC FREQUENCY CONTROL IN A MOBILE STATION DURING IN SPEECH COMMUNICATION MODE

(75) Inventors: Kazuhiro Arimitsu, Tokyo (JP); Masaru Hirata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/408,977

(22) Filed: Sep. 29, 1999

(30) Foreign Application Priority Data

Oct. 1, 1998 (JP) .......................... 10/277915

(51) Int. Cl.[7] .............. H04B 1/06; H04B 7/00
(52) U.S. Cl. .............. 455/259; 455/257; 455/192.2
(58) Field of Search ............. 370/204, 281, 370/343, 330; 375/344; 455/192.1, 196.1, 255–265, 68, 70, 71, 192.2, 192.3

(56) References Cited

U.S. PATENT DOCUMENTS

| | | | | |
|---|---|---|---|---|
| 5,309,429 A | * | 5/1994 | Fukuda ................ 455/257 |
| 5,361,276 A | | 11/1994 | Subramanian ......... 375/150 |
| 5,574,998 A | * | 11/1996 | Andoh ................ 455/260 |
| 5,594,754 A | * | 1/1997 | Dohi et al. ........... 375/344 |
| 5,678,223 A | * | 10/1997 | Callaway, Jr. et al. ... 455/196.1 |
| 6,275,699 B1 | * | 8/2001 | Ichihara .............. 455/434 |

FOREIGN PATENT DOCUMENTS

| | | |
|---|---|---|
| JP | 7-297779 | 11/1995 |
| JP | 8-46653 | 2/1996 |
| JP | 9-261162 | 10/1997 |
| JP | 9-312600 | 12/1997 |
| JP | 10-41786 | 2/1998 |
| JP | 10-41919 | 2/1998 |
| JP | 10-107860 | 4/1998 |
| JP | 10-164658 | 6/1998 |

* cited by examiner

*Primary Examiner*—Dwayne Bost
*Assistant Examiner*—Eliseo Ramos-Feliciano
(74) *Attorney, Agent, or Firm*—Scully, Scott, Murphy & Presser

(57) ABSTRACT

An AFC process is performed even when a mobile station is in a speech communication mode in which a data channel is being received by a finger receiver. In the speech communication mode, a frequency error measuring unit measures a frequency error of the data channel. An AFC circuit performs an AFC process for controlling the frequency of a TCXO, i.e., a reference oscillator, using the measured frequency error. No reception failure occurs even when the TCXO suffers frequency fluctuations in the speech communication mode.

20 Claims, 10 Drawing Sheets

METHOD OF PERFORMING AUTOMATIC FREQUENCY CONTROL IN A MOBILE STATION DURING IN SPEECH COMMUNICATION MODE

BACKGROUND OF THE INVENTION

1. Field of the Invention

The present invention relates to a CDMA (Code Division Multiple Access) communication system, and more particularly to a method of performing an AFC (Automatic Frequency Control) process in a mobile station in such CDMA communication system.

2. Description of the Related Art

Recent years have seen much attention to a CDMA communication system that is highly resistant to interferences and disturbances as a mobile communication system. In the CDMA communication system, a transmitting station spreads a user signal to be transmitted with a spreading code and transmits the spread signal, and a receiving station despreads the spread signal using a spreading code which is the same as the spreading code used by the transmitting station for thereby obtaining the original user signal.

The receiving station cannot despread the spread signal unless the spreading codes used in the transmitting and receiving stations are synchronized in phase with each other. To achieve the spreading code synchronization, mobile stations of the CDMA communication system use a TCXO (Temperature Controlled Xtal Oscillator) of very high frequency accuracy as a reference oscillator for generating a reference frequency signal for use in modulating signals received from a base station, and perform an AFC process for equalizing the frequency of the reference frequency signal to the frequency of a reference frequency signal of the base station which serves as a transmitting station.

The AFC process is carried out based on a pilot symbol contained in data that are transmitted from the base station to the mobile station.

The physical format of a down link for data transmission from a base station to a mobile station will be described below with reference to FIG. 1 of the accompanying drawings.

Data transmitted from the base station comprises a plurality of radio frames 31 each having an interval of 10 ms. Each of the radio frames 31 comprises 16 time slots $32_1$ through $32_{16}$. Each of the time slots $32_1$ through $32_{16}$ contains pilot symbols 33. While the pilot symbols 33 have different values depending on the time slots $32_1$ through $32_{16}$, they have a predetermined pattern. Therefore, the mobile station is capable of recognizing pilot symbols to be transmitted before receiving the pilot symbols. There are four pilot symbols contained in each time slot. The mobile station can measure a frequency error with respect to the base station using the four pilot symbols per time slot.

The frequency error will be described below with reference to FIG. 2 of the accompanying drawings. In the CDMA communication system, QPSK (Quadrature Phase Shift Keying) is employed as a primary modulation process to be effected on data before the data is spread, and hence each symbol comprises 2-bit data, i.e., each symbol takes a value of (0, 0), (0, 1), (1, 0), or (1, 1). These values as plotted in a vector-diagram are shown in FIG. 2. In FIG. 2, the horizontal axis represents the magnitude of an In-phase component (I) and the vertical axis the magnitude of a Quadrature component (Q). In FIG. 2, a frequency error between measured data 91 of a first pilot symbol and measured data 90 of a second pilot symbol is θ.

Immediately after a mobile station in a CDMA mobile communication system is turned on, the mobile station performs an AFC process using a BCCH (Broadcast Control Channel). When the frequency error between a reference frequency and the frequency of a signal received from the base station becomes smaller than a certain value, the mobile station determines the frequency as locked, and terminates the AFC process.

Operation of the mobile station after it has been turned on and until it enters a waiting mode will be described below with reference to FIG. 3 of the accompanying drawings. When the mobile station is turned on, the mobile station receives all BCCHs which can be received in step 201, and identifies a base station which is transmitting the BCCH whose field intensity is greatest, i.e., whose S/N ratio is best, of all the received BCCHS, in step 202. A BCCH is a one-way control channel for broadcasting control information from the base station to the mobile station.

In step 203, the mobile station transmits information such as of an ID number of the base station to the base station via a RACH (Random Access Channel). The base station transmits various items of information to the mobile station via a FACH (Forward Access Channel) in step 204.

The mobile station stores the received information, and enters a waiting mode for receiving a PCH (Paging Channel) from the base station in steps 205, 206.

If the mobile station is notified of an incoming call via the PCH in step 206, then the mobile station receives a BCCH to obtain information again from the base station in step 207. In step 208, the mobile station receives a DTCH (Data Channel) to begin speech communications. When the speech communications end, the mobile station enters the waiting mode again in steps 205, 206.

In step 201 or 202 immediately after the mobile station is turned on, the mobile station performs the AFC process using the received BCCH. Once the frequency is locked in the AFC, the mobile station does not perform the AFC process again.

However, while the mobile station is in speech communication with the base station via the DTCH, the frequency of the reference frequency signal outputted from the reference oscillator may fluctuate due to the heat generated by an amplifier which generates transmission power. Furthermore, if the speech communication mode continues for a long period of time, then the reference frequency signal may fluctuate owing to changes in the ambient temperature of the mobile station. As a consequence, an error between the reference frequency of the base station and the reference frequency of the mobile station becomes greater than a certain value due to a change in the frequency of the reference frequency signal, so that the mobile station tends to fail to properly despread data transmitted from the base station.

SUMMARY OF THE INVENTION

It is therefore an object of the present invention to provide a method of performing an AFC process in a mobile station for preventing received data from failing to be despread even if the frequency of a reference oscillator fluctuates in a speech communication mode and even if the phase varies due to fading.

To achieve the above object, in accordance with an aspect of the present invention, there is provided a method of performing an automatic frequency control process in a mobile station to equalize the frequency of a reference frequency signal for use in demodulating a signal received from a base station, with the frequency of a reference frequency signal in the base station. The automatic frequency control process is carried out in a speech communication mode in which a data channel transmitted from said base station is being received.

According to another aspect of the present invention, the automatic frequency control process is carried out using a broadcast control channel or a data channel in a speech communication mode in which the data channel transmitted from said base station is being received.

According to still another aspect of the present invention, if a frequency error measured using a data channel transmitted from said base station is greater than a predetermined value, said automatic frequency control process is carried out using a broadcast control channel in a speech communication mode in which said data channel is being received.

With the above arrangements, since the AFC process is carried out using the data channel or the broadcast control channel even in the speech communication mode in which the data channel is being received, no reception failure occurs even when a reference oscillator suffers frequency fluctuations in the speech communication mode.

According to yet another aspect of the present invention, said automatic frequency control process is carried out using a broadcast control channel when the broadcast control channel is received as instructed by said base station in a speech communication mode in which a data channel transmitted from said base station is being received.

With the above arrangement, inasmuch as the AFC process is carried out using the broadcast control channel when the broadcast control channel in the speech communication mode in an ordinary processing sequence, the AFC process can be performed without the need for no special processing for receiving the broadcast control channel.

The AFC process may be carried out by controlling a reference oscillator which generates the reference frequency signal.

The above and other objects, features, and advantages of the present invention will become apparent from the following description with reference to the accompanying drawings which illustrate examples of the present invention.

DETAILED DESCRIPTION OF THE PREFERRED EMBODIMENTS

1st Embodiment

Figure 4:
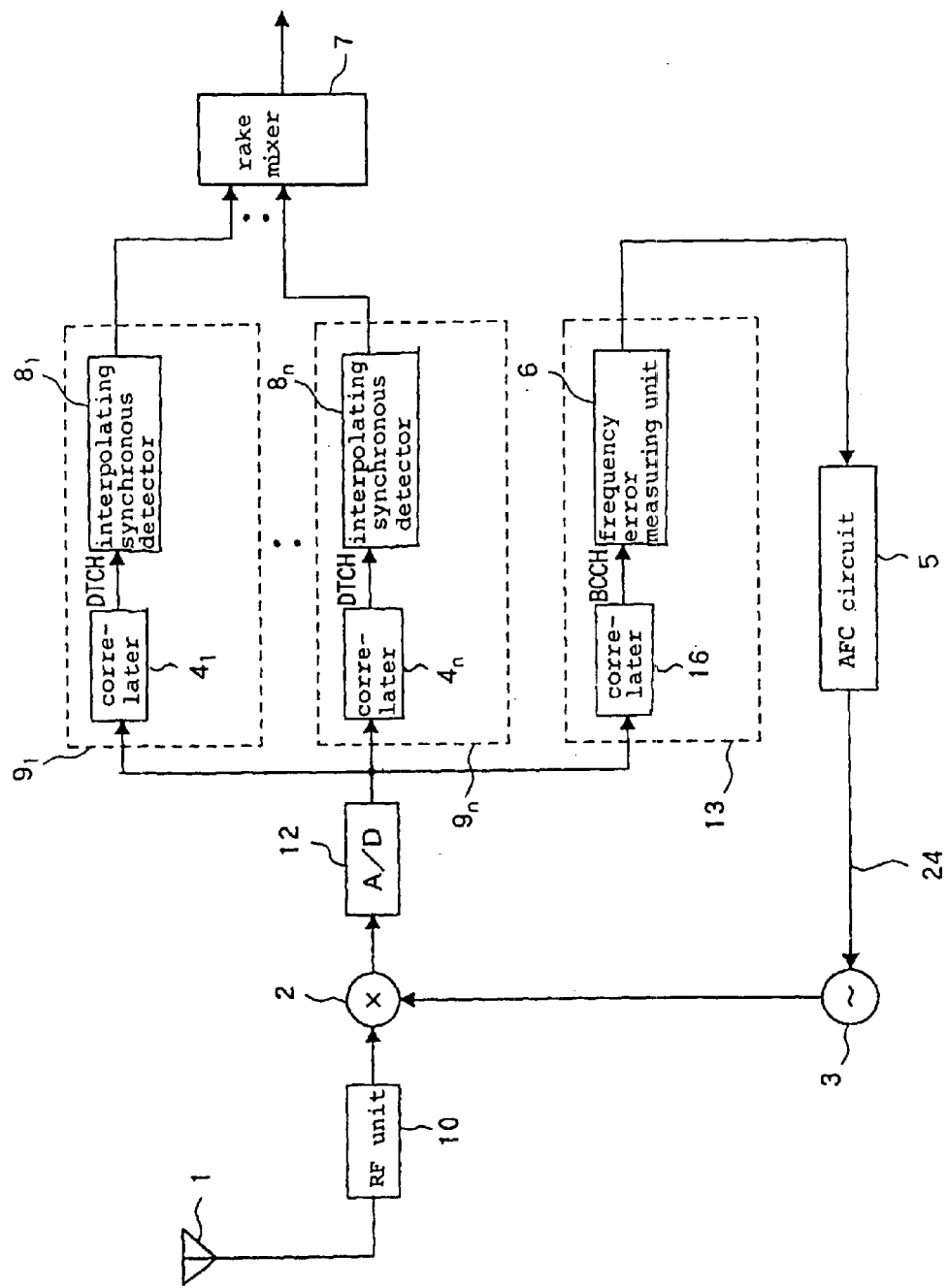
FIG. 4 is a block diagram of a mobile station according to a first embodiment of the present invention.

As shown in FIG. 4, a mobile station according to a first embodiment of the present invention comprises an antenna 1, an RF (Radio Frequency) unit 10, a mixer 2, a TCXO 3, an A/D converter 12, n finger receivers $9_1$ through $9_n$, a finger receiver 13, an AFC circuit 5, and a rake mixer 7.

The finger receivers $9_1$ through $9_n$ comprise respective correlators $4_1$ through $4_n$ and respective interpolating synchronous detectors $8_1$ through $8_n$.

The RF unit 10 selects a signal having a certain frequencies from signals received by the antenna 1, amplifies the selected signal, and outputs the amplified signal as a high-frequency signal.

The mixer 2 multiplies the high-frequency signal from the RF unit 10 by a reference frequency signal generated by the TCXO 3 for thereby converting the high-frequency signal into a baseband signal at a chip rate. The TCXO 3 outputs, as the reference frequency signal, a signal whose frequency has been controlled by a control voltage 24 from the AFC circuit 5. The A/D converter 12 converts the baseband signal at the chip rate from the mixer 2 into a digital signal.

Figure 5:
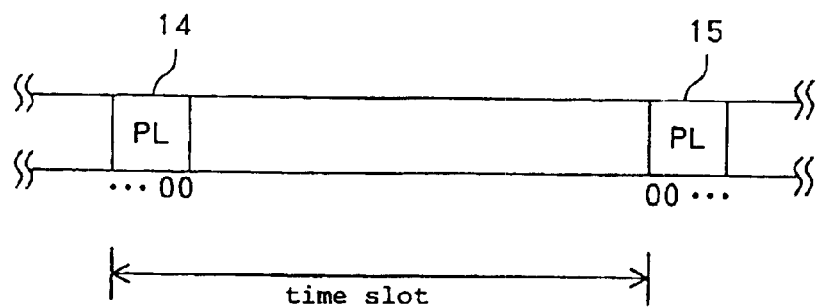
FIG. 5 is a diagram of a signal format illustrative of operation of interpolating synchronous detectors.

The correlators $4_1$ through $4_n$ despread the digital signal from the A/D converter 12 using a spreading code corresponding to a DTCH thereby to demodulate DTCH data. The interpolating synchronous detectors $8_1$ through $8_n$ determine phase errors from pilot symbols contained in desired signals produced by the correlators $4_1$ through $4_n$, and correct the desired signals so as to reduce the phase errors. Operation of the interpolating synchronous detectors $8_1$ through $8_n$ will be described below with reference to FIGS. 5 and 6.

It is assumed that data are to be transmitted in which a pilot symbol 14 in a certain time slot is (0, 0) and a pilot symbol 15 in a next time slot is also (0, 0).

Figure 6:
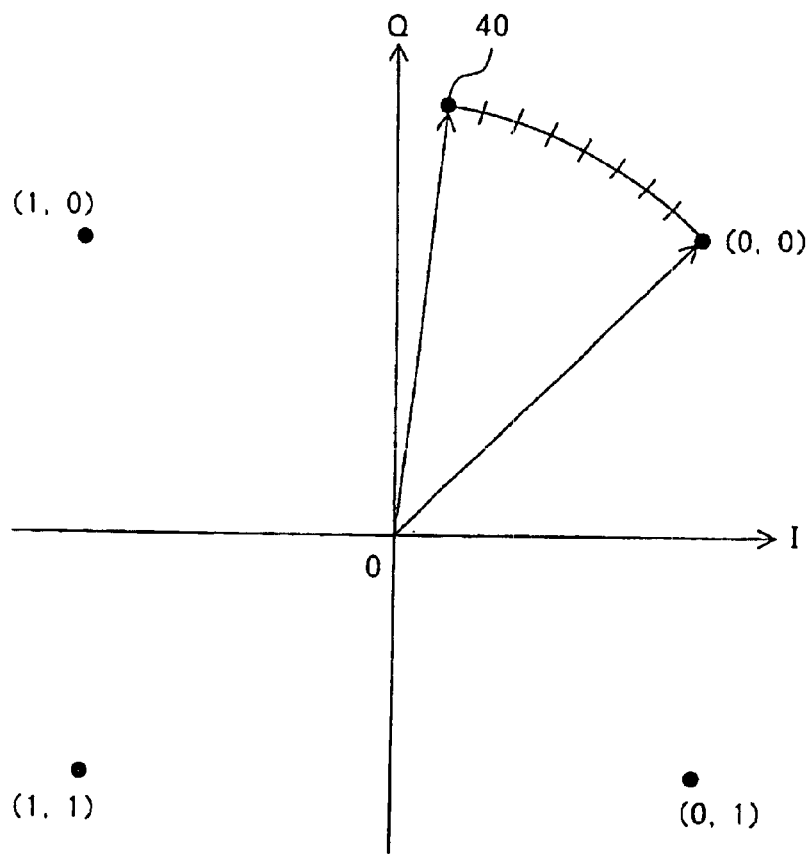
FIG. 6 is a vector diagram illustrative of operation of the interpolating synchronous detectors.

The data whose pilot symbol is (0, 0) is shown at a position (0, 0) in FIG. 6 if the data does not contain any phase error in an ideal state. However, if the value of the pilot symbol 15 is obtained at a position indicated as measured data 40 though the value of the pilot symbol 15 is obtained at the position (0, 0), then it is presumed that a phase error has occurred in an interval after the pilot symbol 14 is received until the pilot symbol 15 is received. Therefore, the interpolating synchronous detectors $8_1$ through $8_n$ determine that measured values of other symbols between the symbols 14, 15 similarly contain a phase error, and correct phase error components estimated with respect to the obtained values.

The rake mixer 7 combines signals which have been corrected in phase by the interpolating synchronous detectors $8_1$ through $8_n$, at a maximum ratio.

The finger receiver 13 comprises a correlator 16 and a frequency error measuring unit 6.

The correlator 16 despreads a digital signal from the A/D converter 12 using a spreading code corresponding to a BCCH for thereby demodulating the data of the BCCH. The frequency error measuring unit 6 determines a frequency error from a pilot symbol contained in a desired signal produced by the correlator 16.

Figure 7:
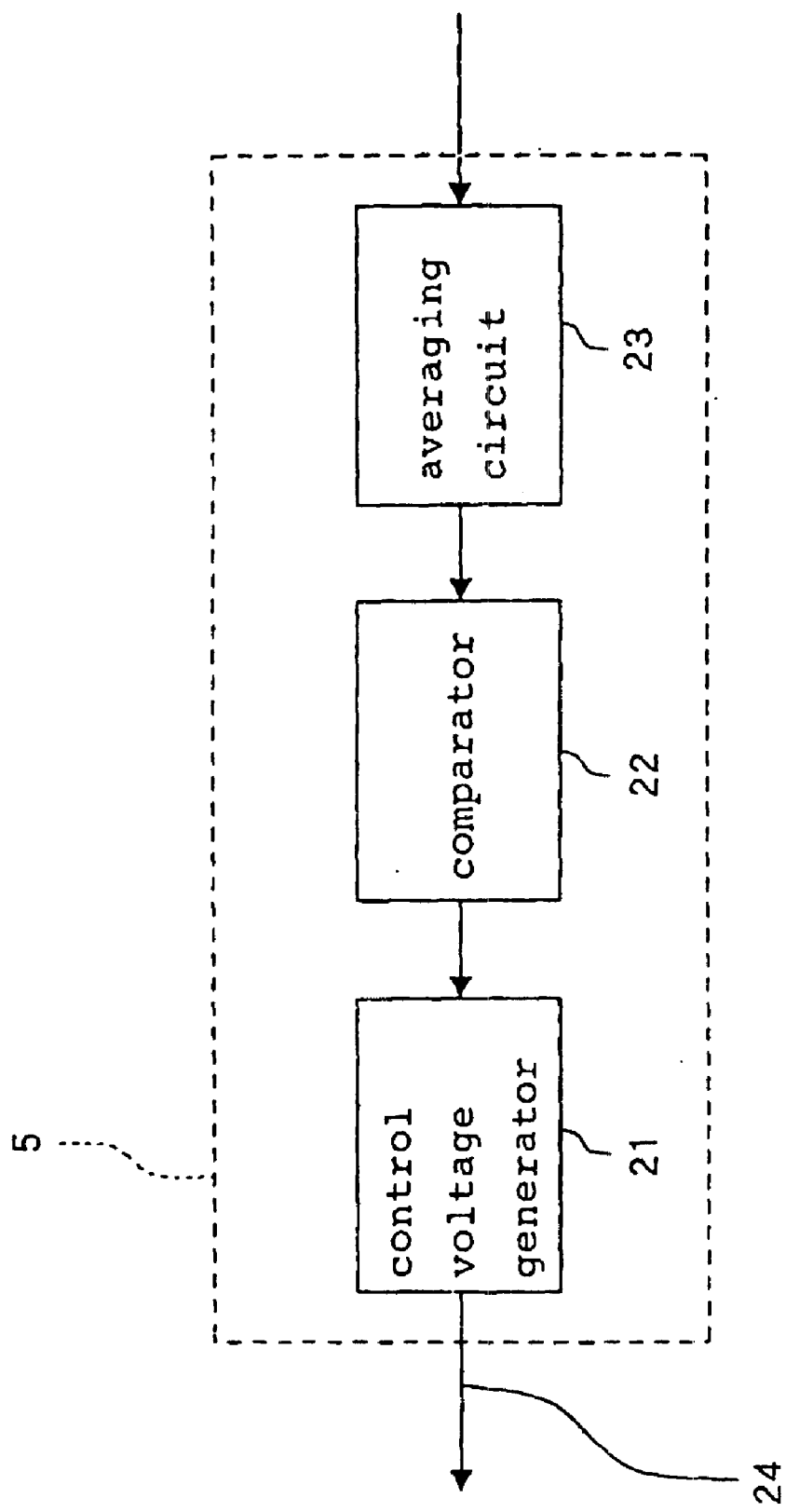
FIG. 7 is a block diagram of an AFC circuit in the mobile station shown in FIG. 4.

As shown in FIG. 7, the AFC circuit 5 comprises an averaging circuit 23, a comparator 22, and a control voltage generator 21.

The averaging circuit 23 determines an average of frequency errors determined by the frequency error measuring unit 6. The comparator 22 compares the average determined by the averaging circuit 23 with a predetermined value. Based on the compared result from the comparator 22, the control voltage generator 21 generates and outputs a control voltage 24 for controlling an output frequency from the TCXO 3. The control voltage generator 21 also maintains the control voltage 24 at a constant level after the frequency is locked in the AFC circuit 5.

Operation of the mobile station according to the first embodiment will be described in detail below with reference to FIG. 4.

An RF signal from the antenna 1 is frequency-converted into a chip rate signal by the mixer 2, and the chip rate signal is converted into a digital signal by the A/D converter 12. The digital signal is supplied to the finger receivers $9_1$ through $9_n$ in which it is despread by the correlators $4_1$ through $4_n$ to demodulate a DTCH. The interpolating synchronous detectors $8_1$ through $8_n$ remove fading from the DTCH, and the rake mixer 7 combines the signals at a maximum ratio and outputs the combined signal.

The BCCH demodulated by the correlator 16 is supplied to the frequency error measuring unit 6, which determines frequency errors. The frequency errors determined by the frequency error measuring unit 6 are supplied to the AFC circuit 5. In the AFC circuit 5, the averaging circuit 23 calculates an average of the frequency errors supplied from the frequency error measuring unit 6, and the comparator 22 compares with the average with a predetermined value. The control voltage generator 21 generates and outputs a control voltage 24 for controlling the frequency of the reference frequency signal from the TCXO 3 based on the compared result from the comparator 22.

The frequency of the reference frequency signal from the TCXO 3 is controlled by the AFC process in the AFC circuit 5 to synchronize the chip rate signal from the mixer 2 with the reference frequency of the base station.

In the mobile station according to the first embodiment, since the AFC process using the BCCH is carried out even in the speech communication mode, no reception failure occurs even if the TCXO 3 suffers frequency fluctuations in the speech communication mode.

In the first embodiment, the finger receiver 13 is dedicated to the reception of a BCCH. However, the AFC process may be carried out only when the frequency error becomes greater than a predetermined value.

In the first embodiment, only one finger receiver 13 is employed for receiving a BCCH. However, if the mobile station has 10 finger receivers, for example, then a plurality of, e.g., two or three, finger receivers may be assigned for receiving a BCCH. Such plural finger receivers for receiving a BCCH are effective to increase the accuracy of an obtained frequency error and hence the accuracy of the AFC process.

2nd Embodiment

Figure 8:
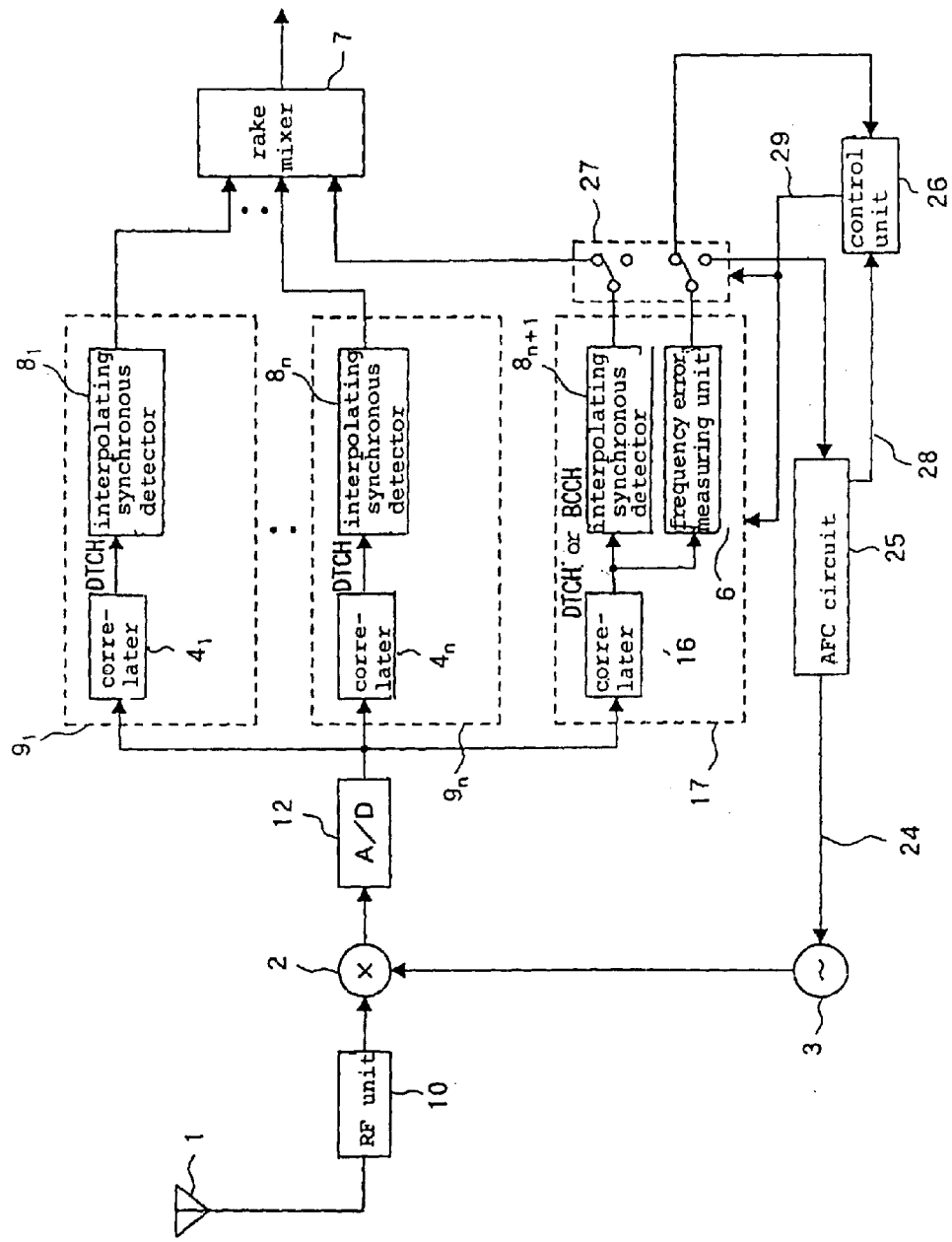
FIG. 8 is a block diagram of a mobile station according to a second embodiment of the present invention.

A mobile station according to a second embodiment of the present invention will be described below with reference to FIG. 8.

In the first embodiment, the finger receiver 13 is dedicated to the reception of a BCCH for performing the AFC process in the speech communication mode. According to the second embodiment, when a frequency error measured using a DTCH becomes greater than a predetermined value, at least one finger receiver is switched from a DTCH reception mode to a BCCH reception mode, and the AFC process is carried out using a BCCH. After the frequency is locked in the AFC process, the finger receiver is switched from the BCCH reception mode to the DTCH reception mode. With this arrangement, unless the AFC process is performed, the number of data combined by the rake mixer is increased for improved reception characteristics.

The mobile station according to the second embodiment differs from the mobile station according to the first embodiment shown in FIG. 4 in that the AFC circuit 5 is replaced with an AFC circuit 25, the finger receiver 13 is replaced with a finger receiver 17, and a control unit 26 and a switching unit 27 are newly added.

The finger receiver 17 comprises a correlator 16, an interpolating synchronous detector $8_{n+1}$ and a frequency error measuring unit 6.

If a control signal 29 from the control unit 36 is inactive, then the correlator 16 of the finger receiver 17 despreads a digital signal from the A/D converter 12 using a spreading code corresponding to a DTCH for thereby demodulating the data of the DTCH. If the control signal 29 is active, then the correlator 16 despreads a digital signal from the A/D converter 12 using a spreading code corresponding to a BCCH for thereby demodulating the data of the BCCH.

If the control signal 29 is inactive, the switching unit 27 outputs an output signal from the interpolating synchronous detector $8_{n+1}$ to the rake mixer 7, and also outputs a frequency error determined by the frequency error measuring unit 6 to the control unit 26. If the control signal 29 is active, the switching unit 27 does not output an output signal from the interpolating synchronous detector $8_{n+1}$ to the rake mixer $20_1$, and outputs a frequency error determined by the frequency error measuring unit 6 to the AFC circuit 25.

The AFC circuit 25 functions in the same manner as the AFC circuit 5 shown in FIG. 4, and also functions to output an AFC lock signal 28 when the frequency is locked in the AFC circuit 25. The control unit 26 is supplied with a frequency error from the frequency error measuring unit 6 via the switching unit 27. If the frequency error becomes greater than a predetermined value, then the control unit 26 makes the control signal 29 active, causing the AFC circuit 25 to start the AFC process. When the AFC circuit 25 outputs the AFC lock signal 28 and the control unit 26 detects when the frequency is locked in the AFC circuit 25, the control unit 26 makes the control signal 29 inactive.

Figure 1:
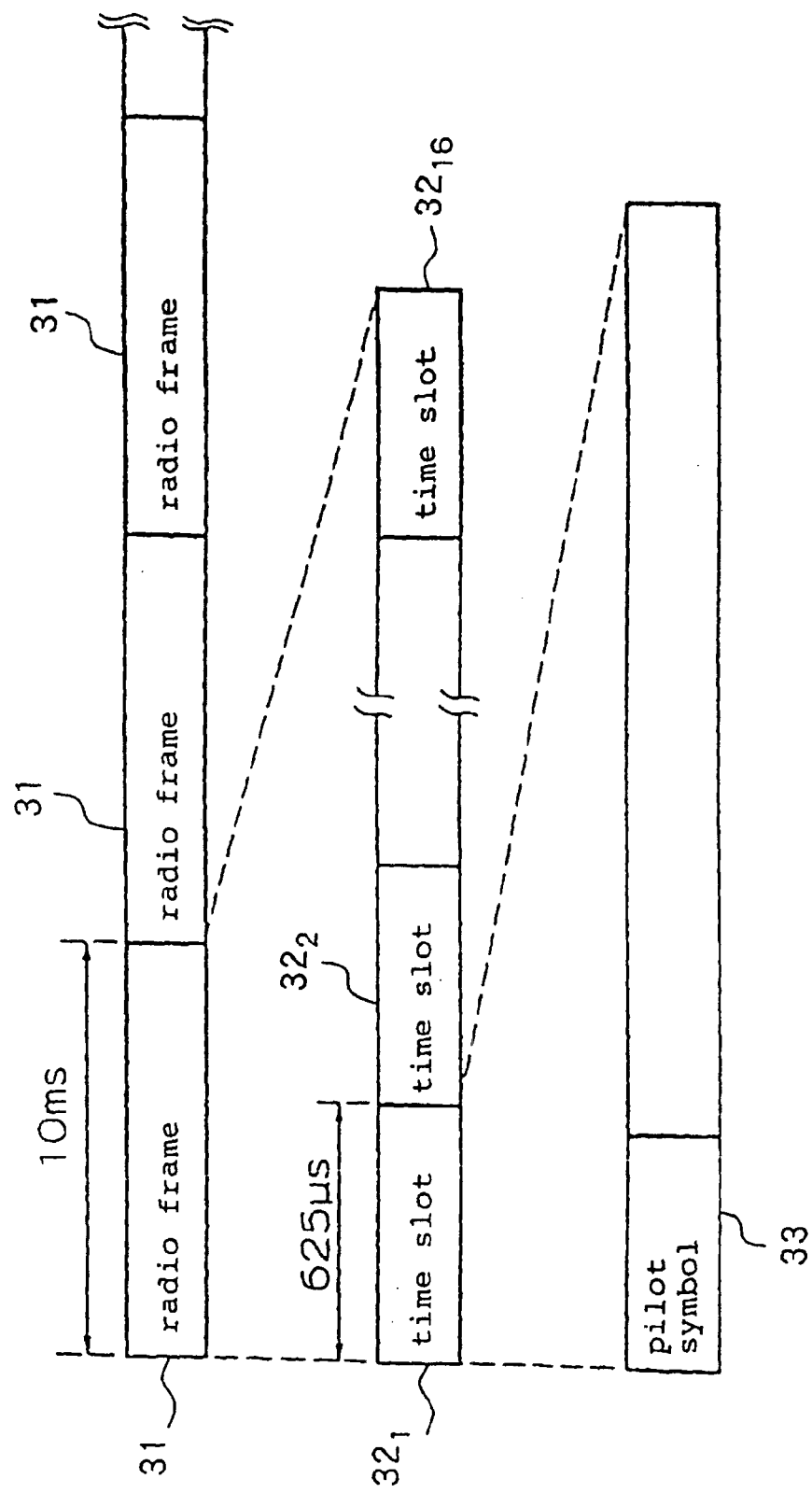
FIG. 1 is a diagram showing the physical format of a down link in a CDMA communication system.
Figure 2:
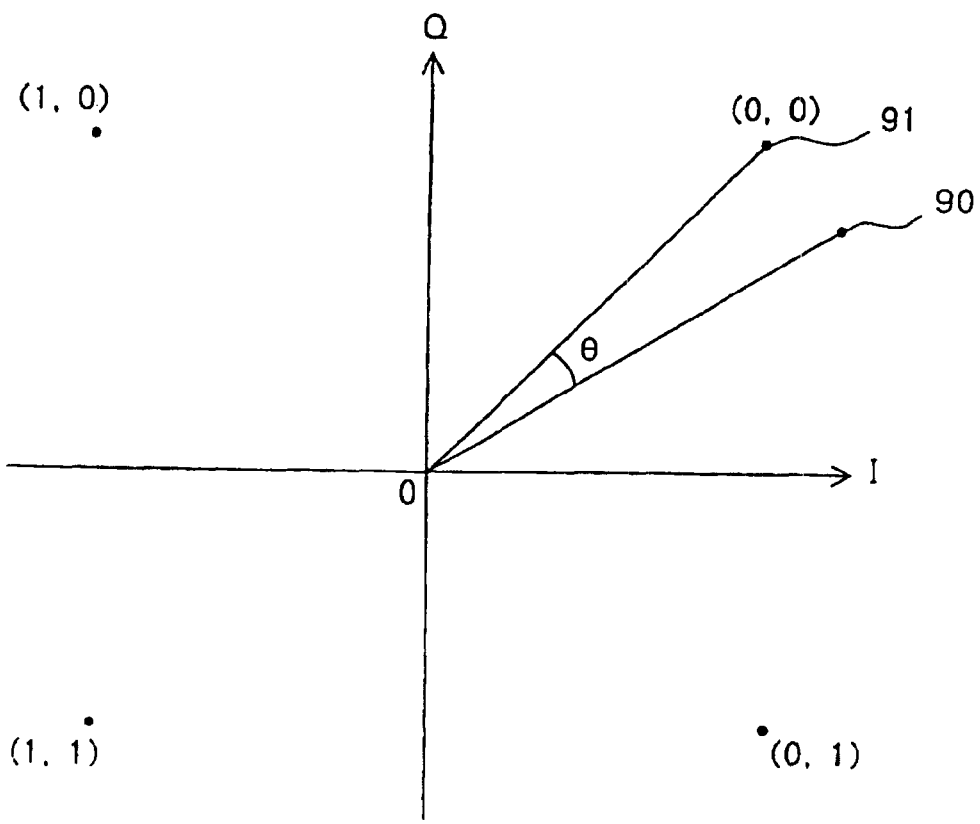
FIG. 2 is a vector diagram illustrative of a frequency error.
Figure 3:
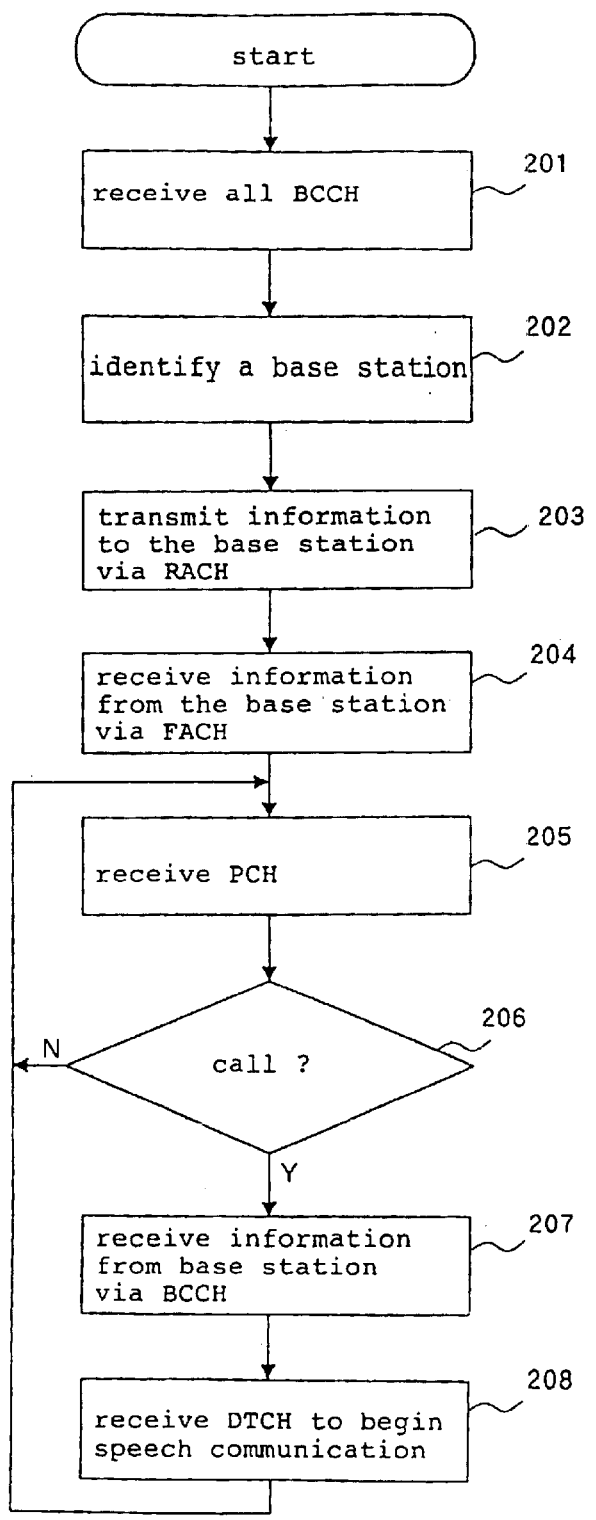
FIG. 3 is a flowchart of an operation sequence of a general mobile station.
Figure 9:
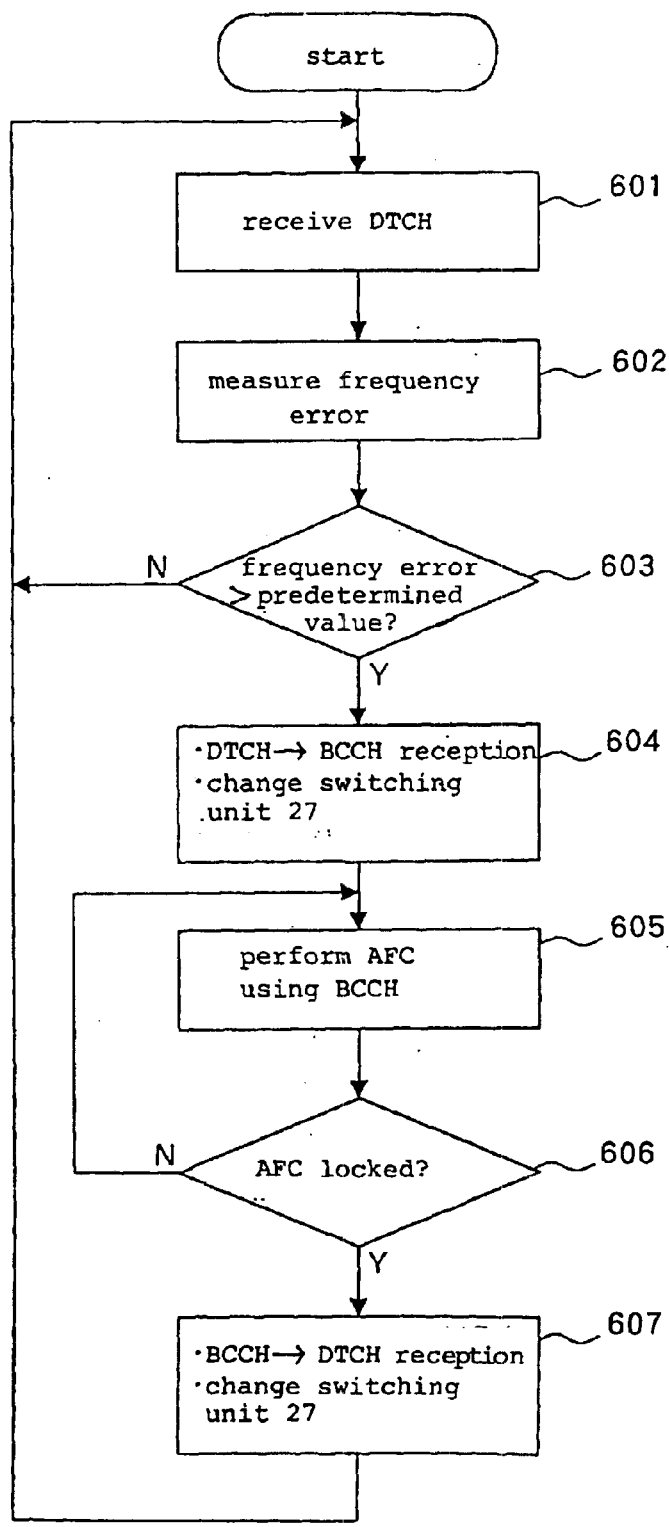
FIG. 9 is a flowchart of an operation sequence of the mobile station shown in FIG. 8.

An operation sequence of finger receiver 17 of the mobile station according to the second embodiment will be described below with reference to FIG. 9. The operation sequence shown in FIG. 9 is executed in step 208 of the flowchart shown in FIG. 3.

When the mobile station receives a DTCH in step 601, the control unit 26 measures a frequency error of the DTCH in step 602. The control unit 26 then decides whether the measured frequency error is greater than a predetermined value or not in step 603. If the frequency error is greater than the predetermined value, then the control unit 26 makes the control signal 29 active in step 604. Since the control signal 29 becomes active, the finger receiver 17 is switched from a DTCH reception mode to a BCCH reception mode. The control unit 26 controls the switching unit 27 such that the switching unit 27 does not output an output signal from the interpolating synchronous detector $8_{n+1}$ to the rake mixer 7, and outputs a frequency error determined by the frequency error measuring unit 6 to the AFC circuit 25.

In step 605, the AFC circuit 25 performs the AFC process using a BCCH. The AFC circuit 25 decides whether the frequency is locked in the AFC process or not in step 606. If the frequency is locked in the AFC process, then the AFC circuit 25 outputs an AFC lock signal 28, and the control unit 26 makes the control signal 29 inactive in step 607. Since the control signal 29 becomes inactive, the finger receiver 17 is switched from the BCCH reception mode to the DTCH reception mode. The control unit 26 controls the switching unit 27 to output the output signal from the interpolating synchronous detector $8_{n+1}$ to the rake mixer 7, and also output the frequency error determined by the frequency error measuring unit 6 to the control unit 26.

While the BCCH is being received by the finger receiver 17 in the processing of steps 604 through 607, the finger receivers $9_1$ through $9_n$ is receiving the DTCH, and hence the speech communication mode is continuing.

In the second embodiment, only one finger receiver 17 is employed for receiving a BCCH. However, if the mobile station has 10 finger receivers, for example, then a plurality of, e.g., two or three, finger receivers may be assigned for receiving a BCCH. Such plural finger receivers for receiving a BCCH are effective to increase the accuracy of an obtained frequency error and hence the accuracy of the AFC process.

3rd Embodiment

A mobile station according to a third embodiment of the present invention will be described below with reference to FIG. 10.

In the first and second embodiments, at least one finger receiver 13 or 17 needs to be provided for receiving a BCCH in the speech communication mode for performing the AFC process. If the first and second embodiments are applied without reducing the number of finger receivers for receiving a DTCH, then the number of finger receivers will be increased, necessarily resulting in an increase in the current consumption.

The mobile station according to the third embodiment is designed to solve the above problem, i.e., to perform the AFC process in the speech communication mode without increasing the current consumption due to the AFC process performed using the DTCH.

Figure 10:
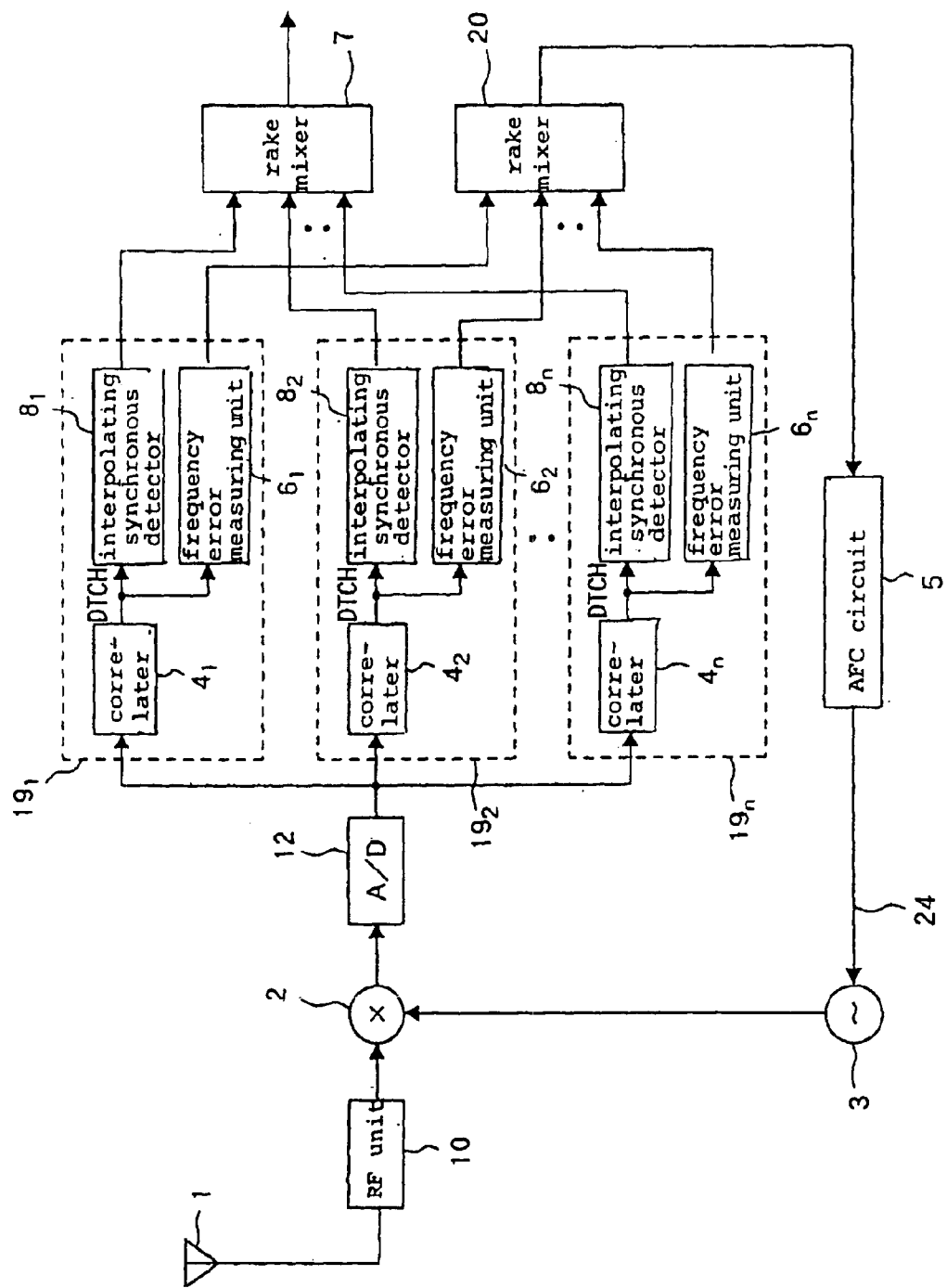
FIG. 10 is a block diagram of a mobile station according to a third embodiment of the present invention.

As shown in FIG. 10, the mobile station according to the third embodiment differs from the mobile station shown in FIG. 4 in that the finger receivers $9_1$ through $9_n$ are replaced with finger receivers $19_1$ through $19_n$, the finger receiver 13 is deleted, and a rake mixer 20 is newly added. The finger receivers $19_1$ through $19_n$ differ from the finger receivers $9_1$ through $9_n$ shown in FIG. 4 in that they additionally have respective frequency error measuring units $6_1$ through $6_n$.

The frequency error measuring units $6_1$ through $6_n$ determine frequency errors from pilot symbols contained in desired signals produced by the correlators $4_1$ through $4_n$. The rake mixer 20 combines frequency error signals from the frequency error measuring units $6_1$ through $6_n$ at a maximum ratio.

The frequency errors which are combined by the rake mixer 20 are supplied to the AFC circuit 5, which generates a control voltage 24 for controlling the frequency of the reference frequency signal from the TCXO 3. The AFC circuit 5 may perform the AFC process at all times based on the frequency error, but should preferably perform the AFC process if the frequency error exceeds a predetermined value.

In this embodiment, since the AFC process can be performed while in the speech communication mode with the n finger receivers $19_1$ through $19_n$ receiving a DTCH, it is not necessary to provide a finger receiver for receiving a BCCH. Thus, the AFC process can be achieved in the speech communication mode without increasing the current consumption.

In the speech communication mode, the transmission power of a down link from the base station to the mobile station is controlled so as to be constant in the mobile station. Therefore, the reception power at the time the DTCH is received is constant as compared with the reception power at the time other channels such as the BCCH are received, so that the effect of fading, etc. is suppressed. Consequently, the reliability of data at the time the DTCH is received is higher than the reliability of data at the time other channels such as the BCCH are received, with the result that the AFC process can be performed highly accurately using the DTCH.

In FIG. 10, all the n finger receivers $19_1$ through $19_n$ determine frequency errors, which are combined by the rake mixer 20 for the AFC process. However, since the reliability of data at the time the DTCH is received is high, the AFC process can be performed in the speech communication mode even with at least one finger receiver for determining a frequency error.

While the mobile station is in the speech communication mode receiving a data channel transmitted from the base station, the mobile station may receive a broadcast control channel as instructed by the base station. In this case, the mobile station may perform the AFC process using the broadcast channel in the speech communication mode without changing the ordinary processing.

4th Embodiment

Figure 11:
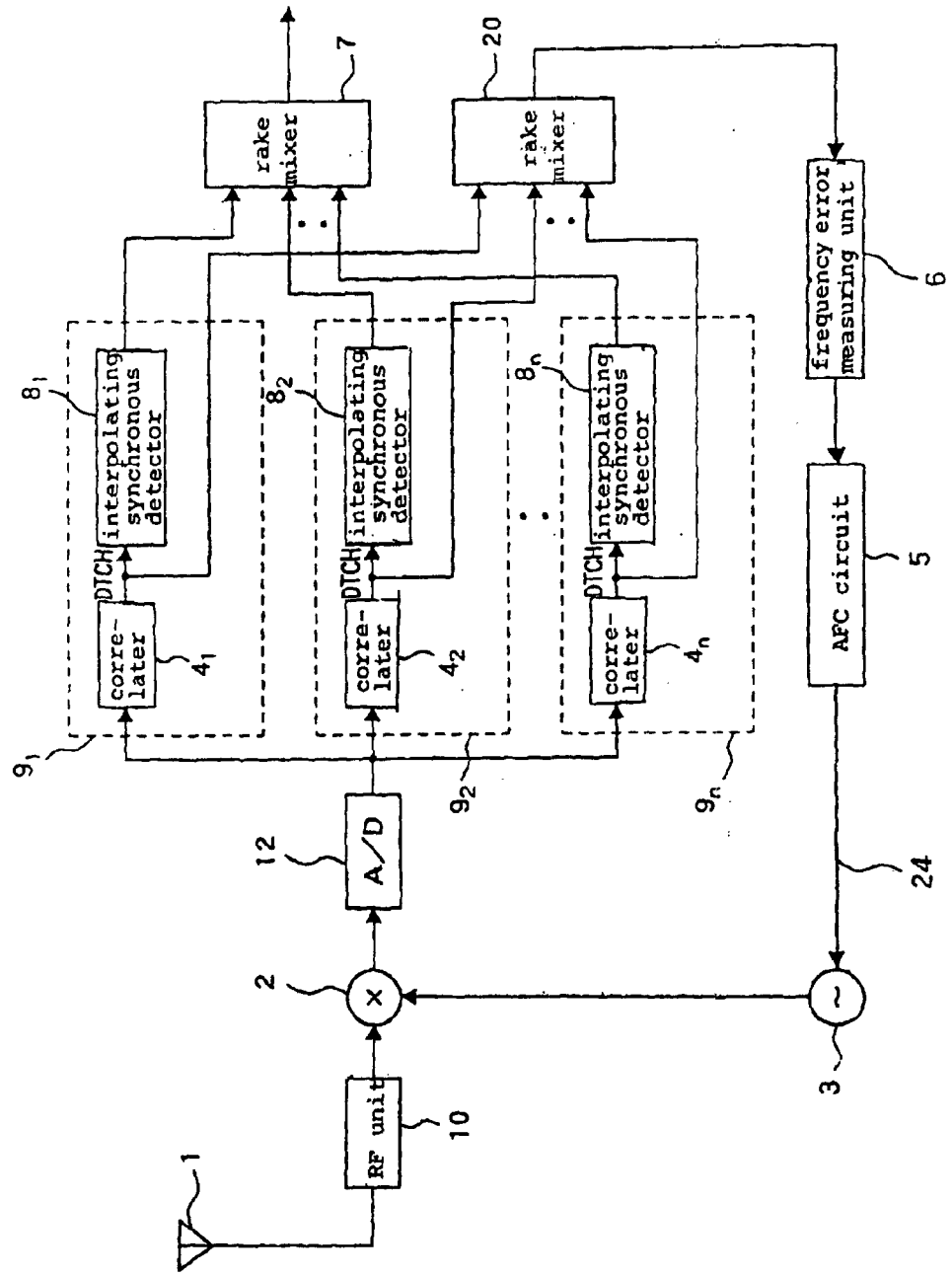
FIG. 11 is a block diagram of a mobile station according to a fourth embodiment of the present invention.

As shown in FIG. 11, a mobile station according to a fourth embodiment of the present invention differs from the mobile station according to the third embodiment shown in FIG. 10 in that the finger receivers $19_1$ through $19_n$ are replaced with finger receivers $9_1$ through $9_n$, respectively, and a frequency error measuring unit 6 is newly added.

According to the fourth embodiment, the rake mixer 20 combines and outputs signals despread by the correlators $4_1$ through $4_n$ at a maximum ratio. The frequency error measuring unit 6 according to the fourth embodiment measures a frequency error of the output signal from the rake mixer 20 at all times or periodically, and outputs the measured frequency error to the AFC circuit 5.

In the third embodiment shown in FIG. 10, frequency errors are measured from the signals despread by the finger receivers $19_1$ through $9_n$, and combined at a maximum ratio. Therefore, the finger receivers $19_1$ through $19_n$ require the respective frequency error measuring units $6_1$ through $6_n$.

According to the fourth embodiment, however, the signals despread by the finger receivers $9_1$ through $9_n$ are combined at a maximum ratio by the rake mixer 20, and thereafter the frequency error measuring unit 6 measures a frequency error of the output signal from the rake mixer 20. Consequently, the mobile station according to the fourth embodiment performs the same function as the mobile station according to the third embodiment with the single frequency error measuring unit.

While preferred embodiments of the present invention have been described using specific terms, such description is for illustrative purposes only, and it is to be understood that changes and variations may be made without departing from the spirit or scope of the following claims.

What is claimed is:

1. A method of performing an automatic frequency control process in a mobile station to equalize the frequency of a reference frequency signal for use in demodulating a signal received from a base station with the frequency of a reference frequency signal in the base station, said mobile station comprising:

an antenna;

a radio frequency (RF) unit;

a mixer;

a reference oscillator;

an analog to digital (A/D) converter;

a plurality of finger receivers having correlators and respective interpolating synchronous detectors;

an automatic frequency control (AFC) circuit; and a rake mixer;

said mixer frequency-converting an RF signal from said antenna into a chip rate signal, the chip rate signal being converted into a digital signal by said A/D converter, the digital signal being supplied to said plurality of finger receivers for despreading by said respective correlators to demodulate a data channel (DTCH), said respective interpolating synchronous detectors removing fading from the DTCH, said rake mixer combining the digital signals at a maximum ratio and outputting the combined digital signal;

said method comprising the step of:

carrying out said automatic frequency control process in a speech communication mode in which the data channel (DTCH) transmitted from the base station is being received.

2. A method according to claim 1, wherein said step of carrying out said automatic frequency control process comprises the step of controlling said reference oscillator which generates the reference frequency signal.

3. A method of performing an automatic frequency control process in a mobile station to equalize the frequency of a reference frequency signal for use in demodulating a signal received from a base station with the frequency of a reference frequency signal in the base station, said mobile station comprising:

an antenna;

a radio frequency (RF) unit;

a mixer;

a reference oscillator;

an analog to digital (A/D) converter;

a plurality of finger receivers having correlators and respective interpolating synchronous detectors;

a dedicated finger receiver having a correlator and a respective frequency error measuring unit, said dedicated finger receiver dedicated to reception of a broadcast control channel (BCCH) for performing an automatic frequency control (AFC) process in a speech communication mode;

an automatic frequency control (AFC) circuit; and a rake mixer;

said mixer frequency-converting an RF signal from said antenna into a chip rate signal, the chip rate signal being converted into a digital signal by said A/D converter, the digital signal being supplied to said plurality of finger receivers for despreading by said respective correlators to demodulate a data channel (DTCH), said respective interpolating synchronous detectors removing fading from the DTCH, said rake mixer combining the digital signals at a maximum ratio and outputting the combined digital signal;

said correlator of said dedicated finger receiver despreading a digital signal from said A/D converter thereby demodulating data of a broadcast control channel (BCCH), said respective frequency error measuring unit determining a frequency error from a pilot symbol contained in a pilot signal contained in a desired signal produced by said correlator having a respective frequency error measuring unit, said method comprising the step of:

carrying out said automatic frequency control process using a broadcast control channel (BCCH) in a speech communication mode in which the data channel (DTCH) transmitted from the base station is being received.

4. A method according to claim 3, wherein said step of carrying out said automatic frequency control process comprises the step of controlling said reference oscillator which generates the reference frequency signal.

5. A method of performing an automatic frequency control process in a mobile station to equalize the frequency of a reference frequency signal for use in demodulating a signal received from a base station with the frequency of a reference frequency signal in the base station, said mobile station comprising:

an antenna;

a radio frequency (RF) unit;

a mixer;

a reference oscillator;

an analog to digital (A/D) converter;

a plurality of finger receivers having correlators and respective interpolating synchronous detectors;

a rake mixer;

a dedicated finger receiver having a correlator and both a respective interpolating synchronous detector and a respective frequency error measuring unit;

a control unit; and a switching unit for switching between activation and de-activation of a signal to said rake mixer from said interpolating synchronous detector of said dedicated finger receiver, and for switching between activation and de-activation of a signal to said control unit of a signal from said respective frequency error measuring unit of said dedicated finger receiver;

said mixer frequency-converting an RF signal from said antenna into a chip rate signal, the chip rate signal being converted into a digital signal by said A/D converter, the digital signal being supplied to said plurality of finger receivers for despreading by said respective correlators to demodulate a data channel (DTCH), said respective interpolating synchronous detectors removing fading from the DTCH, said rake mixer combining the digital signals at a maximum ratio and outputting the combined digital signal;

said method comprising the step of:

if a frequency error measured using a data channel (DTCH) transmitted from the base station is greater than a predetermined value, carrying out said automatic frequency control process using a broadcast control channel(BCCH) in a speech communication mode in which the data channel (DTCH) is being received.

6. A method according to claim 5, wherein said step of carrying out said automatic frequency control process comprises the step of controlling said reference oscillator which generates the reference frequency signal.

7. A method of performing an automatic frequency control process in a mobile station to equalize the frequency of a reference frequency signal for use in demodulating a signal received from a base station with the frequency of a reference frequency signal in the base station, said mobile station comprising:
an antenna;
a radio frequency (RF) unit;
a mixer;
a reference oscillator;
an analog to digital (A/D) converter;
a plurality of finger receivers each having correlators and both a respective interpolating synchronous detector and a respective frequency error measuring unit;
a first rake mixer;
a second rake mixer; and
an automatic frequency control (AFC) circuit;
said mixer frequency-converting an RF signal from said antenna into a chip rate signal, the chip rate signal being converted into a digital signal by said A/D converter, the digital signal being supplied to said plurality of finger receivers for despreading by said respective correlators to demodulate a data channel (DTCH), said respective interpolating synchronous detectors removing fading from the DTCH, said first rake mixer combining the digital signals at a maximum ratio and outputting the combined digital signal;
said frequency error measuring units determining frequency errors from pilot symbols contained in desired signals produced by said correlators, said second rake mixer combining the frequency error signals from said frequency error measuring units at a maximum ratio, said frequency errors combined by said second rake mixer being supplied to said AFC circuit for controlling the frequency of the reference signal from said reference oscillator;
said method comprising the step of:
carrying out said automatic frequency control process using a broadcast control channel (BCCH) when the broadcast control channel is received as instructed by the base station in a speech communication mode in which the data channel transmitted from the base station is being received.

8. A method according to claim 7, wherein said step of carrying out said automatic frequency control process comprises the step of controlling said reference oscillator which generates the reference frequency signal.

9. A method of performing an automatic frequency control process in a mobile station to equalize the frequency of a reference frequency signal for use in demodulating a signal received from a base station with the frequency of a reference frequency signal in the base station, said mobile station comprising:
an antenna;
a radio frequency (RF) unit;
a mixer;
a reference oscillator;
an analog to digital (A/D) converter;
a plurality of finger receivers each having correlators and respective interpolating synchronous detectors;
a first rake mixer;
a second rake mixer;
a frequency error measuring unit; and
an automatic frequency control (AFC) circuit;
said mixer frequency-converting an RF signal from said antenna into a chip rate signal, the chip rate signal being converted into a digital signal by said A/D converter, the digital signal being supplied to said plurality of finger receivers for despreading by said respective correlators to demodulate a data channel (DTCH), said respective interpolating synchronous detectors removing fading from the DTCH, said first rake mixer combining the digital signals at a maximum ratio and outputting the combined digital signal;
said second rake mixer combining and outputting signals from said respective correlators, the signals despread by said respective correlators at a maximum ratio;
said frequency error measuring unit measuring a frequency error of the output signal of said second rake mixer, the frequency error being supplied to said AFC circuit for controlling the frequency of the reference signal from said reference oscillator;
said method comprising the step of:
carrying out said automatic frequency control process using the data channel (DTCH) transmitted from the base station in a speech communication mode in which the data channel is being received.

10. A method according to claim 9 wherein said step of carrying out said automatic frequency control process comprises the step of controlling said reference oscillator which generates the reference frequency signal.

11. A mobile station which performs an automatic frequency control process to equalize the frequency of a reference frequency signal for use in demodulating a signal received from a base station with the frequency of a reference frequency signal in the base station, said mobile station comprising:
an antenna;
a radio frequency (RF) unit;
a mixer;
a reference oscillator;
an analog to digital (A/D) converter;
a plurality of finger receivers having correlators and respective interpolating synchronous detectors;
an automatic frequency control (AFC) circuit; and
a rake mixer;
said mixer frequency-converting an RF signal from said antenna into a chip rate signal, the chip rate signal being converted into a digital signal by said A/D converter, the digital signal being supplied to said plurality of finger receivers for despreading by said respective correlators to demodulate a data channel (DTCH), said respective interpolating synchronous detectors removing fading from the DTCH, said rake mixer combining the digital signals at a maximum ratio and outputting the combined digital signal;
said mobile station carrying out said automatic frequency control process in a speech communication mode in which the data channel (DTCH) transmitted from the base station is being received.

12. A mobile station according to claim 11, wherein said automatic frequency control process is comprised of controlling said reference oscillator which generates the reference frequency signal.

13. A mobile station which performs an automatic frequency control process to equalize the frequency of a reference frequency signal for use in demodulating a signal received from a base station with the frequency of a reference frequency signal in the base station, said mobile station comprising:

an antenna;

a radio frequency (RF) unit;

a mixer;

a reference oscillator;

an analog to digital (A/D) converter;

a plurality of finger receivers having correlators and respective interpolating synchronous detectors;

a dedicated finger receiver having a correlator and a respective frequency error measuring unit, said dedicated finger receiver dedicated to reception of a broadcast control channel (BCCH) for performing an automatic frequency control (AFC) process in a speech communication mode;

an automatic frequency control (AFC) circuit; and a rake mixer;

said mixer frequency-converting an RF signal from said antenna into a chip rate signal, the chip rate signal being converted into a digital signal by said A/D converter, the digital signal being supplied to said plurality of finger receivers for despreading by said respective correlators to demodulate a data channel (DTCH), said respective interpolating synchronous detectors removing fading from the DTCH, said rake mixer combining the digital signals at a maximum ratio and outputting the combined digital signal;

said correlator of said dedicated finger receiver despreading a digital signal from said AID converter thereby demodulating data of a broadcast control channel (BCCH), said respective frequency error measuring unit determining a frequency error from a pilot symbol contained in a pilot signal contained in a desired signal produced by said correlator having a respective frequency error measuring unit;

said mobile station carrying out said automatic frequency control process using a broadcast control channel (BCCH) in a speech communication mode in which the data channel (DTCH) transmitted from the base station is being received.

14. A mobile station according to claim 13, wherein said automatic frequency control process is comprised of controlling said reference oscillator which generates the reference frequency signal.

15. A mobile station which performs an automatic frequency control process to equalize the frequency of a reference frequency signal for use in demodulating a signal received from a base station with the frequency of a reference frequency signal in the base station, said mobile station comprising:

an antenna;

a radio frequency (RF) unit;

a mixer;

a reference oscillator;

an analog to digital (A/D) converter;

a plurality of finger receivers having correlators and respective interpolating synchronous detectors;

a rake mixer;

a dedicated finger receiver having a correlator and both a respective interpolating synchronous detector and a respective frequency error measuring unit;

a control unit; and a switching unit for switching between activation and de-activation of a signal to said rake mixer from said interpolating synchrous detector of said dedicated finger receiver, and for switching between activation and de-activation of a signal to said control unit of a signal from said respective frequency error measuring unit of said dedicated finger receiver;

said mixer frequency-converting an RF signal from said antenna into a chip rate signal, the chip rate signal being converted into a digital signal by said A/D converter, the digital signal being supplied to said plurality of finger receivers for despreading by said respective correlators to demodulate a data channel (DTCH), said respective interpolating synchronous detectors removing fading from the DTCH, said rake mixer combining the digital signals at a maximum ratio and outputting the combined digital signal;

said mobile station, if a frequency error measured using a data channel (DTCH) transmitted from the base station is greater than a predetermined value, carrying out said automatic frequency control process using a broadcast control channel(BCCH) in a speech communication mode in which the data channel (DTCH) is being received.

16. A mobile station according to claim 15, wherein said automatic frequency control process is comprised of controlling said reference oscillator which generates the reference frequency signal.

17. A mobile station which performs an automatic frequency control process to equalize the frequency of a reference frequency signal for use in demodulating a signal received from a base station with the frequency of a reference frequency signal in the base station, said mobile station comprising:

an antenna;

a radio frequency (RF) unit;

a mixer;

a refererence oscillator;

an analog to digital (A/D) converter;

a plurality of finger receivers each having correlators and both a respective interpolating synchronous detectors and a respective frequency error measuring unit;

a first rake mixer;

a second rake mixer; and an automatic frequency control (AFC) circuit;

said mixer frequency-converting an RF signal from said antenna into a chip rate signal, the chip rate signal being converted into a digital signal by said A/D converter, the digital signal being supplied to said plurality of finger receivers for despreading by said respective correlators to demodulate a data channel (DTCH), said respective interpolating synchronous detectors removing fading from the DTCH, said first rake mixer combining the digital signals at a maximum ratio and outputting the combined digital signal;

said frequency error measuring units determining frequency errors from pilot symbols contained in desired signals produced by said correlators, said second rake mixer combining the frequency error signals from said frequency error measuring units at a maximum ratio, said frequency errors combined by said second rake mixer being supplied to said AFC circuit for controlling the frequency of the reference signal from said reference oscillator;

said mobile station carrying out said automatic frequency control process using a broadcast control channel (BCCH) when the broadcast control channel is received as instructed by the base station in a speech communication mode in which the data channel transmitted from the base station is being received.

18. A mobile station according to claim 17, wherein said automatic frequency control process is comprised of controlling said reference oscillator which generates the reference frequency signal.

19. A mobile station which performs an automatic frequency control process to equalize the frequency of a reference frequency signal for use in demodulating a signal received from a base station, with the frequency of a reference frequency signal in the base station, said mobile station comprising:
- an antenna;
- a radio frequency (RF) unit;
- a mixer;
- a reference oscillator;
- an analog to digital (A/D) converter;
- a plurality of finger receivers each having correlators and respective interpolating synchronous detectors;
- a first rake mixer;
- a second rake mixer;
- a frequency error measuring unit; and
- an automatic frequency control (AFC) circuit;

said mixer frequency-converting an RF signal from said antenna into a chip rate signal, the chip rate signal being converted into a digital signal by said A/D converter, the digital signal being supplied to said plurality of finger receivers for despreading by said respective correlators to demodulate a data channel (DTCH), said respective interpolating synchronous detectors removing fading from the DTCH, said first rake mixer combining the digital signals at a maximum ratio and outputting the combined digital signal;

said second rake mixer combining and outputting signals from said respective correlators, the signals despread by said respective correlators at a maximum ratio;

said frequency error measuring unit measuring a frequency error of the output signal of said second rake mixer, the frequency error being supplied to said AFC circuit for controlling the frequency of the reference signal from said reference oscillator;

said mobile station carrying out said automatic frequency control process using the data channel (DTCH) transmitted from the base station in a speech communication mode in which the data channel is being received.

20. A mobile station according to claim 19, wherein said automatic frequency control process is comprised of controlling said reference oscillator which generates the reference frequency signal.

* * * * *